(12) United States Patent
Shieh et al.

(10) Patent No.: US 6,542,530 B1
(45) Date of Patent: Apr. 1, 2003

(54) ELECTRICALLY PUMPED LONG-WAVELENGTH VCSEL AND METHODS OF FABRICATION

(76) Inventors: Chan-Long Shieh, 6739 E. Bar Z La., Paradise Valley, AZ (US) 85253; Jeff Tsao, 12513 Crested Moss Rd., Albuquerque, NM (US) 87122

( * ) Notice: Subject to any disclaimer, the term of this patent is extended or adjusted under 35 U.S.C. 154(b) by 132 days.

(21) Appl. No.: 09/699,111

(22) Filed: Oct. 27, 2000

(51) Int. Cl.[7] .................................................. H01S 5/187
(52) U.S. Cl. ........................................... 372/46; 372/96
(58) Field of Search ............................ 372/44, 45, 46, 372/96

(56) References Cited

U.S. PATENT DOCUMENTS

| | | | | |
|---|---|---|---|---|
| 5,557,627 A | * | 9/1996 | Schneider | 372/46 |
| 5,617,437 A | * | 4/1997 | Fukunaga | 372/45 |
| 5,747,366 A | * | 5/1998 | Brillouet et al. | 438/44 |
| 5,754,578 A | * | 5/1998 | Jayaraman | 372/50 |
| 5,956,363 A | * | 9/1999 | Lebby et al. | 372/46 |
| 6,057,560 A | * | 5/2000 | Uchida | 257/94 |
| 6,014,400 A | * | 6/2000 | Kobayashi | 372/44 |
| 6,208,680 B1 | * | 3/2001 | Chirvovsky et al. | 372/96 |

* cited by examiner

Primary Examiner—Paul Ip
Assistant Examiner—Phillip Nguyen
(74) Attorney, Agent, or Firm—Parsons & Goltry; Robert A. Parsons; Michael W. Goltry

(57) ABSTRACT

An electrically pumped, long-wavelength VCSEL includes a long wavelength active region having electrical contacts on opposed sides thereof. A layer of semiconductor material is included in the active region having an electrically conductive portion defining a lasing aperture and current confinement volume with the conductive portion being limited by an electrically insulating portion. Windows are formed in the electrical contacts in alignment with the lasing aperture and mirror stacks are positioned on the long wavelength active region in each of the windows. At least one of the mirror stacks includes a metamorphic distributed Bragg reflector for heat conduction.

20 Claims, 6 Drawing Sheets

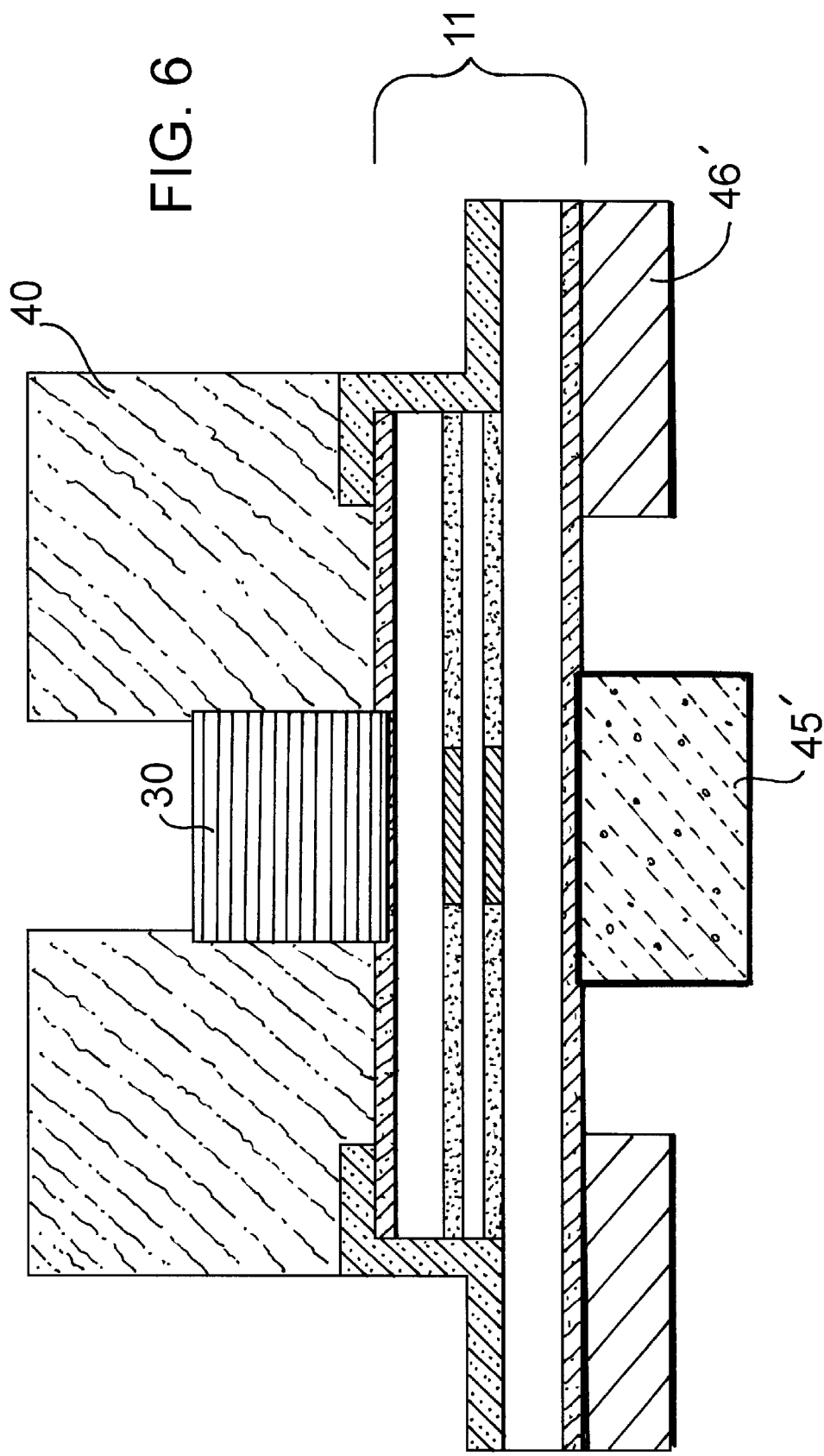

ELECTRICALLY PUMPED LONG-WAVELENGTH VCSEL AND METHODS OF FABRICATION

FIELD OF THE INVENTION

This invention relates to vertical cavity surface emitting lasers capable of emitting long-wavelength light and particularly to electrically pumped long-wavelength vertical cavity surface emitting lasers and to methods of fabrication.

BACKGROUND OF THE INVENTION

Vertical cavity surface emitting lasers (VCSELs) include first and second distributed Bragg reflectors (DBRs) formed on opposite sides of an active area. The VCSEL can be driven or pumped electrically by forcing current through the active area or optically by supplying light of a desired frequency to the active area. Typically, DBRs or mirror stacks are formed of a material system generally consisting of two materials having different indices of refraction and being easily lattice matched to the other portions of the VCSEL. In conventional VCSELs, conventional material systems perform adequately.

However, new products are being developed requiring VCSELs which emit light having long-wavelengths. VCSELs emitting light having long-wavelengths are of great interest in the optical telecommunications industry. This long-wavelength light can be generated by using a VCSEL having an InP based active region. When an InP based active region is used, however, the DBRs or mirror stacks lattice matched to the supporting substrate and the active region do not provide enough reflectivity for the VCSELs to operate because of the insignificant difference in the refractive indices between the two DBR constituents.

Dielectric mirror stacks can be used for VCSEL applications, but they suffer from poor thermal conductivity. Since the performance of these long-wavelength materials is very sensitive to temperature, the thermal conductivity of the DBRs is very important. At least one of the DBRs must have good thermal conductivity to dissipate the heat generated by the laser.

A metamorphically grown DBR has good thermal conductivity and can be used as a heat conducting DBR, as described in United States of America Patent Application entitled "Method of Fabricating Long-Wavelength VCSEL and Apparatus", filed on Aug. 21, 2000, Ser. No. 09/642,359, and incorporated herein by reference. However, it is very difficult to make good electrical contact through the metamorphic DBR, since the interface between the highly defected metamorphic DBR and the active structure results in a high series resistance. Further, any attempts to provide electrical contacts within the structure, instead of at the surfaces, results in current confinement problems that can seriously affect the operation and efficiency of the VCSEL.

Accordingly it is highly desirable to provide electrically pumped long-wavelength VCSELs with good thermal conductivity and methods of fabrication.

It is an object of the present invention to provide new and improved electrically pumped long-wavelength vertical cavity surface emitting lasers.

It is another object of the present invention to provide new and improved electrically pumped long-wavelength vertical cavity surface emitting lasers in which materials with good thermal conductivity and large differences in refractive indices are used.

It is still another object of the present invention to provide new and improved methods of fabricating electrically pumped long-wavelength vertical cavity surface emitting lasers.

It is a further object of the present invention to provide new and improved methods of fabricating electrically pumped long-wavelength vertical cavity surface emitting lasers incorporating materials with good thermal conductivity and large differences in refractive indices.

SUMMARY OF THE INVENTION

The above objects and others are realized in an electrically pumped long-wavelength VCSEL which includes a long wavelength active region having electrical contacts on opposed sides thereof. A layer of material is included in the active region having an electrically conductive portion defining a lasing aperture and current confinement volume with the conductive portion being limited by an electrically insulating portion. In a preferred embodiment, the layer of material contains aluminum, e.g., InAlAs, which is laterally oxidized from the outer edges to form the electrically insulating portion surrounding the electrically conductive portion. Windows are formed in the electrical contacts in alignment with the lasing aperture and mirror stacks are positioned on the long wavelength active region in each of the windows. At least one of the mirror stacks includes a metamorphic distributed Bragg reflector for heat conduction. In the preferred embodiment, the active region is an InP based material epitaxially grown on an InP based substrate.

The above objects and others are further realized in a method of fabricating an electrically pumped long-wavelength VCSEL including a step of forming a long wavelength active region with a first electrical contact on one major side and a second electrical contact on the opposite major side. The long wavelength active region includes at least one layer of material having an electrically conductive portion defining a lasing aperture and current confinement volume, which is limited by an electrically insulating portion. In a preferred embodiment, the layer of material includes an easily oxidizable metal, e.g. aluminum, which is laterally oxidized to produce a centrally located electrically conductive portion defining a lasing aperture and current confinement volume surrounded by the electrically insulating portion. A window is formed in the second electrical contact in alignment with the lasing aperture and a first distributed Bragg reflector mirror stack is metamorphically deposited on the long wavelength active region in the first window. A window is formed in the first electrical contact in alignment with the lasing aperture and a second mirror stack is deposited on the long wavelength active region in the second window. Additional metal is deposited on the first and second metal contacts for support and good electrical conduction.

BRIEF DESCRIPTION OF THE DRAWINGS

Referring to the drawings:

FIG. 6 is a simplified sectional view illustrating modified final steps in another method of fabricating VCSELs in accordance with the present invention.

DESCRIPTION OF THE PREFERRED EMBODIMENTS

Figure 1:
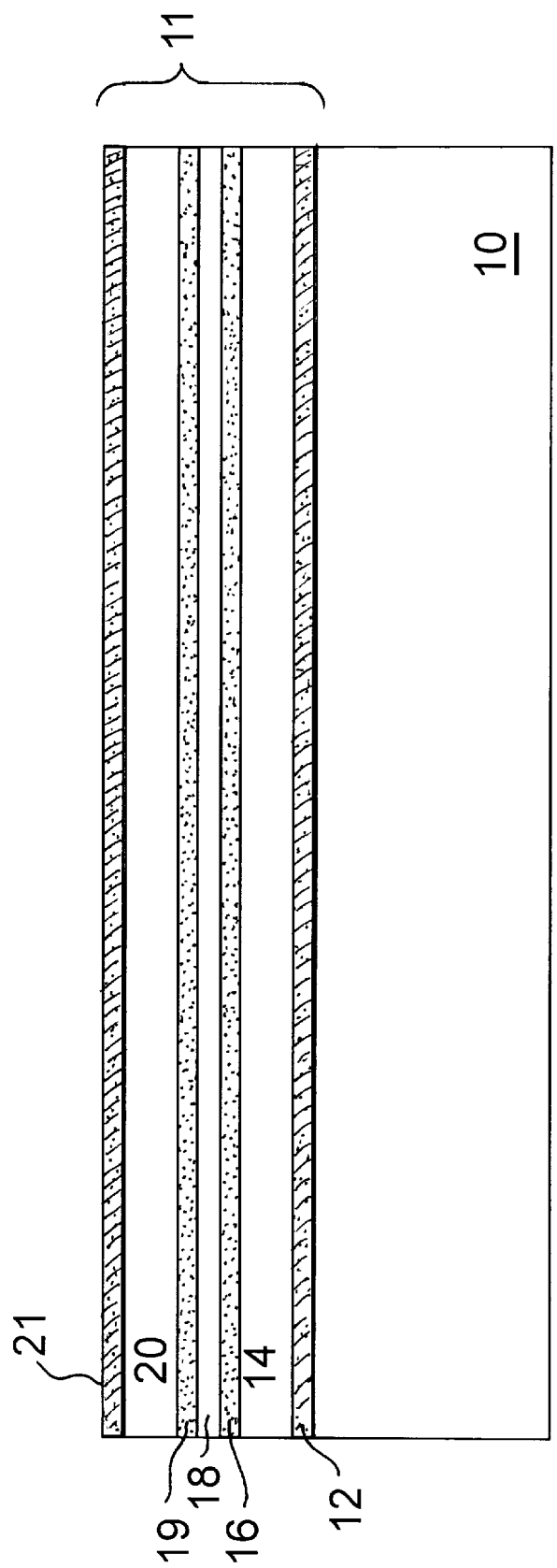
FIGS. 1 through 5 are simplified sectional views illustrating sequential steps in a method of fabricating VCSELs in accordance with the present invention.

Turning now to FIGS. 1 through 5, various steps are illustrated, sequentially, in a method of fabricating vertical cavity surface emitting lasers (VCSELs) in accordance with the present invention. Referring specifically to FIG. 1, a substrate 10 is provided which may be, for example, a semiconductor wafer or the like. A long-wavelength active region 11 is formed on the upper surface of substrate 10 and in this specific embodiment includes a contact layer 12, one or more layers of cladding 14, a layer of transformable material 16, an active area 18 including multiple layers defining one or more quantum wells with interspersed barrier layers, an optional second layer of transformable material 19, one or more layers of cladding 20, and a contact layer 21. It will of course be understood that contact layers 12 and 21 are included in the active region in this discussion only because the entire structure is generally epitaxially grown in a single operation and the inclusion or exclusion does not limit the invention in any way. It will also be understood that layers 12, 14, 16, 18, 19, 20, and 21 are generally deposited or grown in blanket layers over an entire wafer so that a large number of VCSELs are fabricated simultaneously.

Contact layers 12 and 21 include electrically conductive material, which forms a part of lower and upper electrical contacts, as will be explained in more detail presently. Generally, active area 18 includes one or more quantum well layers with barrier layers therebetween and cladding and/or spacer layers 14 and 20 define the upper and lower surfaces. As is understood by those skilled in the art, active region 11 is formed with a thickness of approximately one half of a wavelength to multiple half wavelengths of the emitted light. Cladding layers 14 and 20 are included to provide carrier confinement and phase matching and to this end they generally have higher bandgaps than active area 18. Here it should be understood that, while cladding layers 14 and 20 are illustrated and referred to as single layers, either or both can include multiple layers in various embodiments and for varying purposes.

In a preferred embodiment, active region 11 is based on an indium phosphide (InP) material system to provide a long-wavelength active region. Further, substrate 10 preferably includes InP so that active region 11 can be conveniently epitaxially grown on the surface with the desired crystal lattice matching. For reasons that will be explained in more detail presently, a thin etch-stop layer (not shown) can also be included as a lower portion of active region 11. Generally, the etch-stop layer can be any convenient and compatible material with a large differential etching capability relative to substrate 10.

Figure 2:
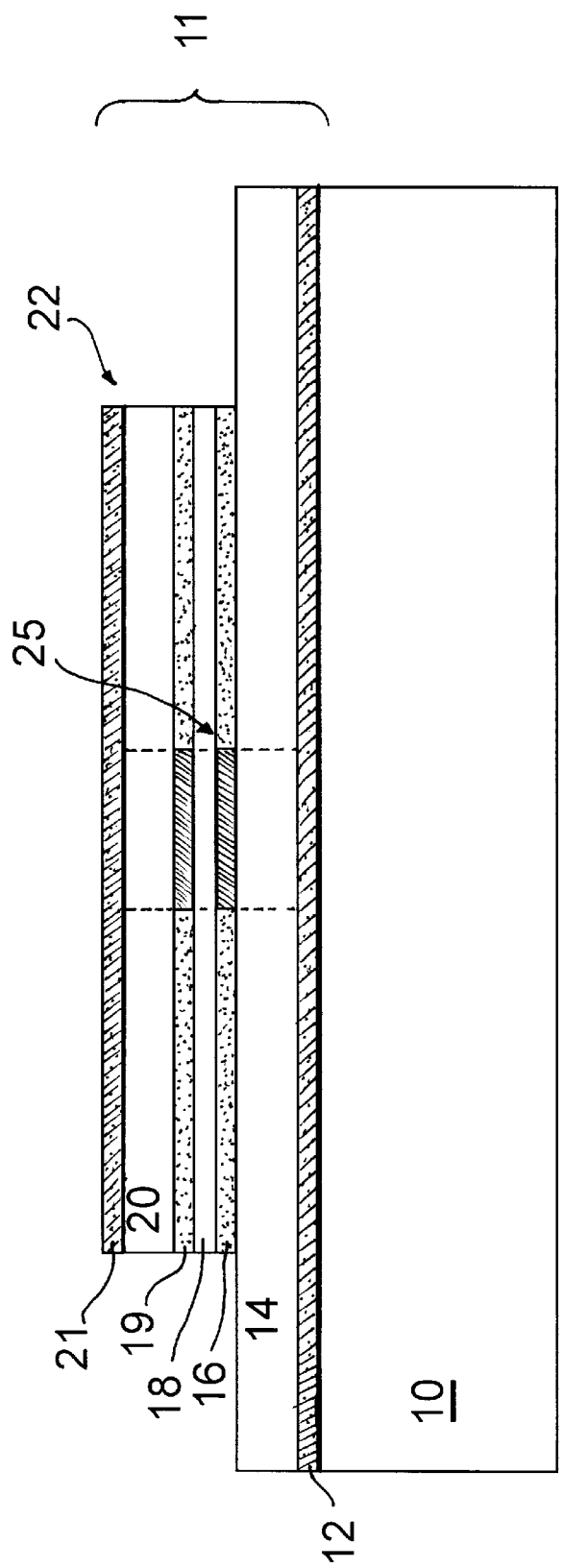

Layers 16 and 19 of transformable material are included for use in forming an electrically conductive portion defining a lasing aperture and current confinement volume, with the electrically conductive portion being limited by an electrically insulating portion. Referring additionally to FIG. 2, a mesa 22 is formed by etching through a portion of active region 11 (in this embodiment, contact layer 21, cladding layer 20, layer 19, active area 18, and layer 16) to expose the edges of layers 16 and 19 and to separate active region 11 into individual VCSELs. It will be understood that if a single layer 16 or 19 is included, or if additional layers of transformable material are included, the etching will proceed at least until the edges of the one or all of the layers of transformable material are exposed Also, it should be understood that mesa 22, and the following structure, is generally circular in shape and illustrates a single VCSEL of the many VCSELs generally fabricated simultaneously on wafer 10.

Layers 16 and/or 19 are formed of any material that can be transformed from an electrical conductor to an electrical insulator, such as an easily oxidizable semiconductor material, an easily etched material, etc. Also, it is preferable that the material of layers 16 and/or 19 can be grown epitaxially with the remaining portions of active region 11. In a preferred embodiment, layers 16 and 19 are formed of InAlAs with a relatively heavy amount of aluminum. With the edges exposed, the aluminum in layers 16 and 19 is oxidized by any convenient means, such as by introducing it into steam or other oxidizing agents. The aluminum in layers 16 and 19 oxidizes much faster than aluminum in any of the other layers of active region 11 (if aluminum is present in any of the other layers) because of the amount of aluminum in layers 16 and 19.

As illustrated in FIG. 2, layers 16 and 19 are oxidized uniformly around mesa 22 to define a lasing aperture and current confinement volume 25 (indicated by broken lines). Because layers 16 and 19 are oxidized outside of volume 25 current is not conducted therethrough and current flowing between contact layers 12 and 21 is limited or confined to volume 25. Also, because current is confined to volume 25, lasing is confined to volume 25 so that the conductive portions of layers 16 and 19 define lasing apertures.

Figure 3:
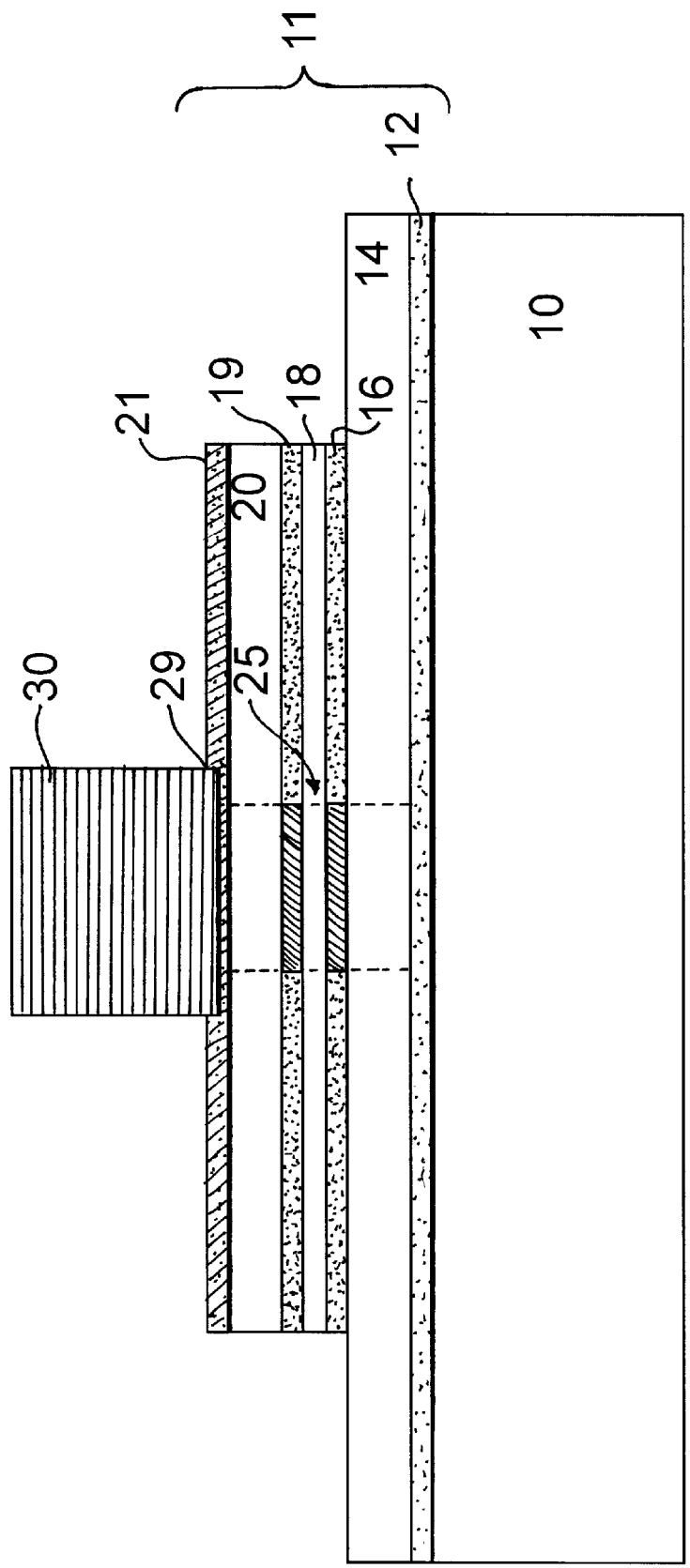
Figure 4:
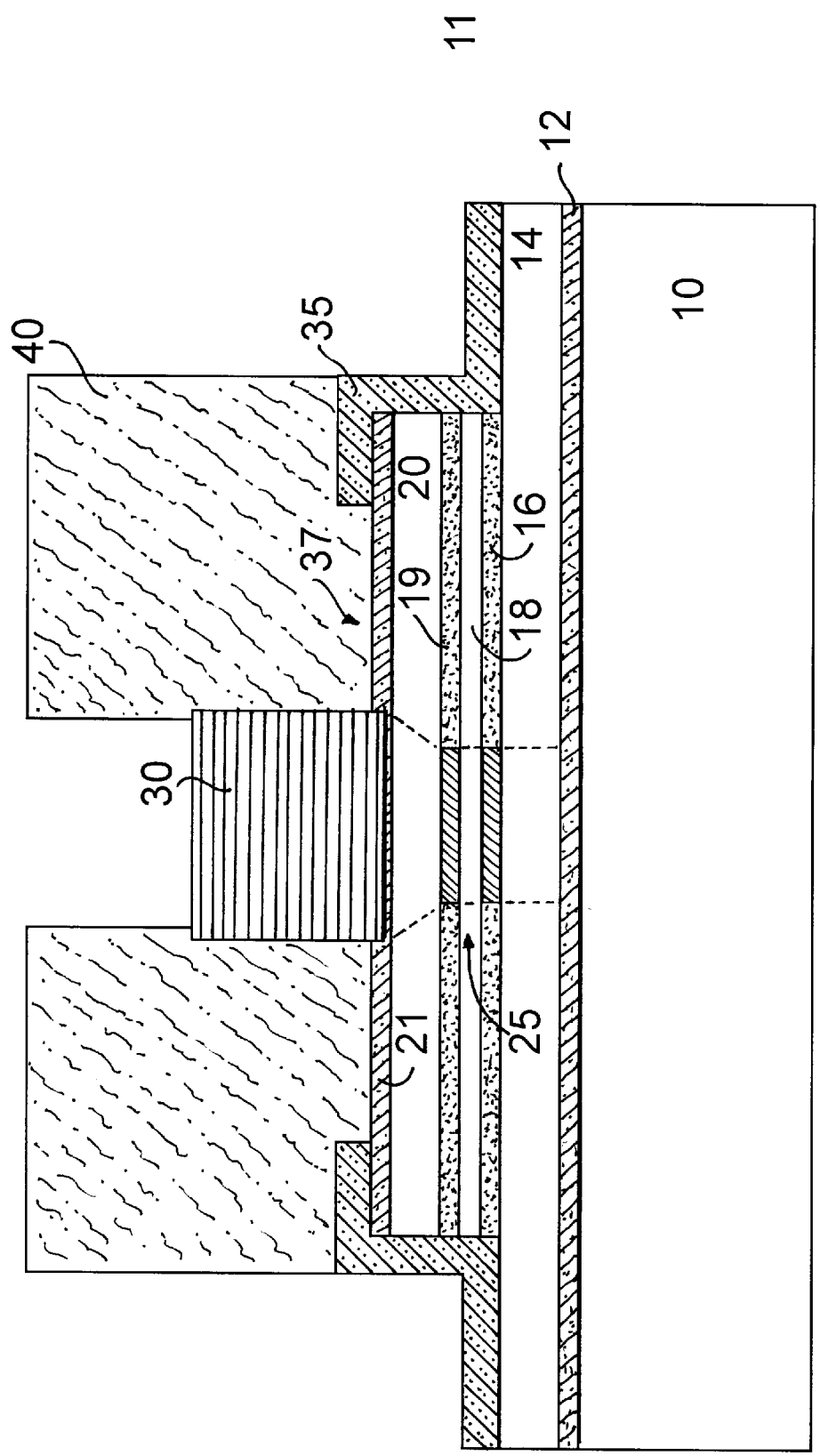

Referring additionally to FIG. 3, a window 29 is formed, by etching or the like, in contact layer 21 so as to expose the upper surface of cladding layer 20. A distributed Bragg reflector (DBR) mirror stack 30 is metamorphically grown on the exposed upper surface of cladding layer 20 of active region 11 in window 29. As known in the art, it is common to epitaxially grow alternate layers of, for example, InGaAsP and InAlGaAs on an InP based active region. The major problem with this type of DBR is that the refractive index difference is too small to provide good reflectivity. Dielectric mirror stacks can be used, but they suffer from poor thermal conductivity. It has been found that materials with good thermal conductivity and refractive indices can be metamorphically grown on long-wavelength active region 11.

Here it should be understood that "metamorphic growth" is a type of epitaxial growth (e.g. by PCVD, MOCVD, PECVD, CVD, sputtering, etc.,) in which the crystal lattice of the grown material does not strictly match the lattice of the substrate. By metamorphically growing the grown material, the lattice of the grown material gradually changes from similar to the lattice of the substrate to the relaxed lattice of the grown material. In this fashion, DBR materials with good thermal conductivity and large differences in the index of refraction can be conveniently grown on a long-wavelength active region. Some examples of pairs of material with good thermal conductivity and index of refraction which can be metamorphically grown on a long-wavelength active region are: layers of $Al_xGa_{1-x}As/Al_yGa_{1-y}As$, where x is in a range of from approximately 0.5 to 1 and y is in a range of from approximately 0 to 0.5; micro-crystalline silicon and micro-crystalline silicon carbide; and micro-crystalline silicon and micro-crystalline aluminum oxide.

During the formation of DBR mirror stack 30, in some procedures metamorphic growth may occur over the entire structure (i.e., contact layer 21, as well as cladding layer 20 in window 29). In these procedures, portions of the metamorphically grown layers overlying contact layer 21 are removed by etching or the like to form the metamorphically grown layers into columns or mirror stacks 30 and to expose contact layer 21 for further process steps. In processes where the metamorphically grown layers are etched into columns, contact layer 21 can be conveniently used as an etch-stop layer.

With DBR mirror stack 30 completed as described, a passivation layer 35 is deposited over the structure. As is understood in the art, passivation layer 35 is utilized primarily to prevent further oxidation of active region 11. A Via 37 is opened through passivation layer 35 to expose the upper surface of contact layer 21 surrounding DBR mirror stack 30. At the same time any passivation material that may have been deposited on DBR mirror stack 30 is removed to expose the side and top surfaces. Second level metallization is performed to deposit contact metal 40 in an ohmic contact with the exposed surface of contact layer 21. Contact metal 40 is also in communication with the sides and a portion of the upper surface of DBR mirror stack 30. The contact with DBR mirror stack 30 enhances heat conduction from the VCSEL, since the metamorphically grown mirror stack is a good heat conductor. Also, contact metal 40 can serve as a mechanical support for the remainder of the process.

Figure 5:
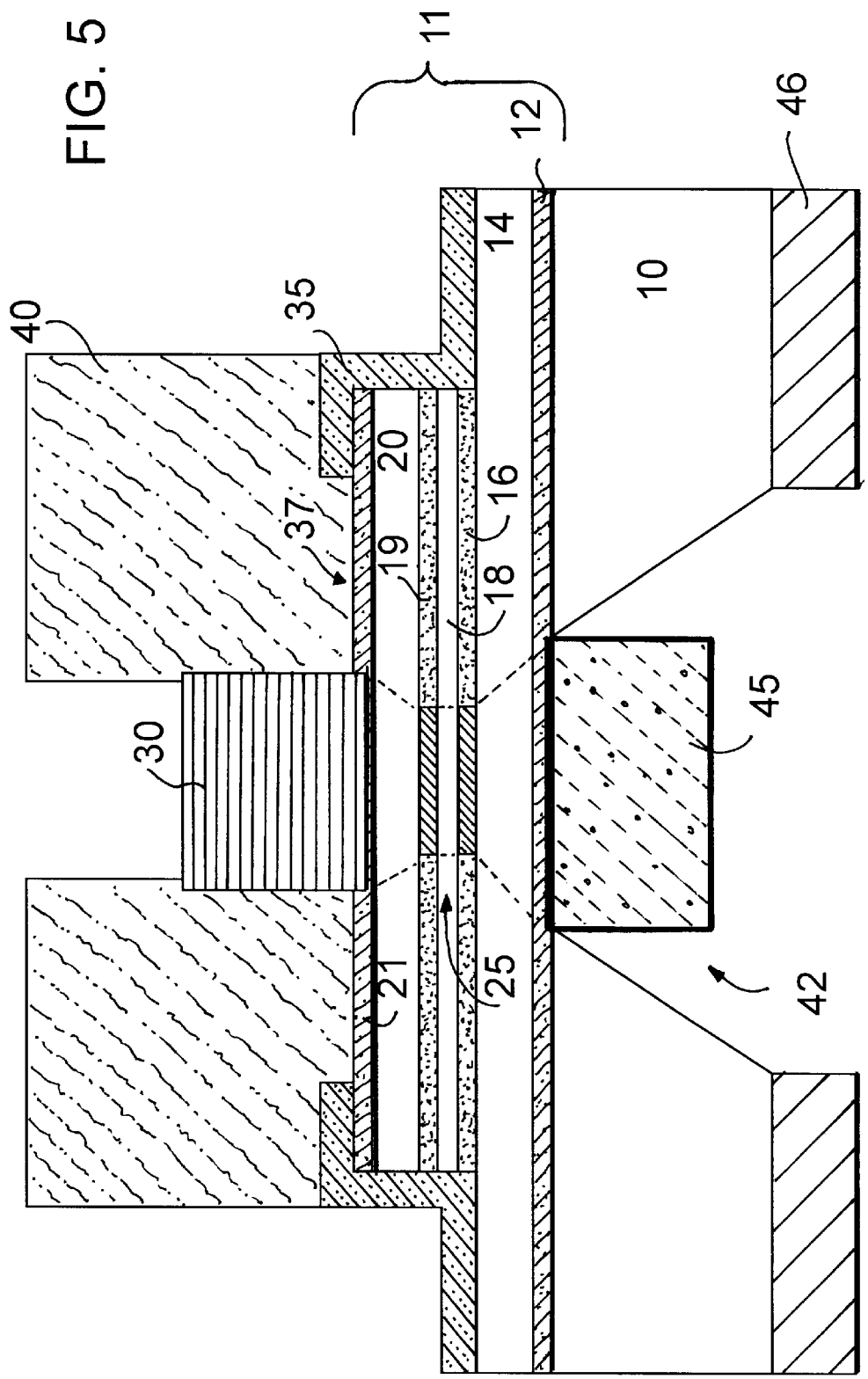

After the upper portion of the VCSEL is completed as described above, a via 42 is etched (or otherwise formed) in substrate 10, as illustrated in FIG. 5. If via 42 is formed by etching, the etch-stop layer (briefly mentioned above) can be used to stop the etch prior to cladding layer 14 or contact layer 12. Via 42 is then continued to remove the etch-stop layer and to define a window through contact layer 12, exposing the lower surface of cladding layer 14. A dielectric mirror stack 45 is deposited on the exposed surface of cladding layer 14. Here it will be understood that a second DBR mirror stack can be metamorphically deposited on cladding layer 14, instead of dielectric mirror stack 45, if desired. Contact metal 46 is deposited on the lower surface of substrate 10 to form the second contact for the VCSEL.

In a specific example of the above described VCSEL, substrate 10 is an InP based semiconductor wafer and long-wavelength active region 11 is InP based material grown epitaxially on substrate 10. Contact layers 12 and 21 include InGis. Long-wavelength active area 18 includes, for example, several quantum well layers of either InGaAsP or InGaAlAs with InP barrier layers therebetween. Cladding layers 14 and 20 include either InGaksP or InGaAlAs sufficiently thick to provide carrier confinement and phase matching and generally have a higher bandgap than active area 18. Mirror stack 30 and/or mirror stack 45 or a mirror stack 45' (See FIG. 6) are metamorphically grown layers of $Al_xGa_{1-x}As/Al_yGa_{1-y}Asf$ where x is in a range of from approximately 0.5 to 1 and y is in a range of from approximately 0 to 0.5. As is understood by those skilled in the art, DBR mirror stack 30 and/or 45/45' includes a sufficient number of mirror pairs (erg., 20 to 40) so as to provide a high reflectivity for light generated by active region 11. As described above, layers 16 and 19 of transformable material preferably include InAlAs, AlAsSb and any other materials with relatively heavy amounts of aluminum and lattice matched or near matched to InP.

Referring to FIG. 6, another embodiment is illustrated of a VCSEL in accordance with the present invention. In this embodiment, the upper portion, including metamorphically grown DBR mirror stack 30 and contact metal 40, are the same as described above. However, instead of forming via 42 in substrate 10, the entire substrate 10 is removed by some means such as etching or the like. In the etching process, the etch-stop layer can be used to limit the etching. A window 42' is formed through contact layer 12 to expose the lower surface of cladding layer 14 and a dielectric mirror stack 45' is deposited in window 42' on the exposed surface of cladding layer 14. Contact metal 46' is deposited directly on the lower surface of contact layer 12. Here it will be understood that mirror stack 45' could be a metamorphically grown DBR mirror stack if desired. Also, contact metal 46' can be positioned in contact with mirror stack 45' to provide additional heat transfer from the VCSEL or upper mirror stack 30 could be a dielectric mirror stack with a lower metamorphically grown mirror stack being used to conduct heat from the VCSEL.

While the steps of the fabrication methods have been described, and will be claimed, in a specific order, it will be clear to those skilled in the art that various steps and procedures may be performed in a different order. It is intended, therefore, that the specific order described or claimed for the various fabrication steps does not in any way limit the invention and any variations in order that still come within the scope of the invention are intended to be covered in the claims.

New and improved electrically pumped, long-wavelength VCSELs have been disclosed incorporating materials with good thermal conductivity and large differences in refractive indices. Further, new and improved methods of fabricating electrically pumped, long-wavelength VCSELs are disclosed utilizing materials with good thermal conductivity and refractive indices. Thus, new and improved electrically pumped, long-wavelength VCSELs can be fabricated with metamorphically grown mirror stacks on either or both sides for heat conduction from either or both sides. Good electrical contacts are made through contact layers on opposite sides of the active region so that the high series resistance of the mirror stacks is not included. Further, current confinement is accomplished through intermediate layers including an electrically conductive portion defining a lasing aperture and current confinement volume and an electrically insulating portion limiting the current confinement volume. Also, the VCSEL embodiments illustrated and disclosed can be fabricated to emit light from either side (e.g. mirror stack 30 or mirror stack 45 of FIG. 5, mirror stack 30 or mirror stack 45' of FIG. 6).

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An electrically pumped, long-wavelength vertical cavity surface emitting laser comprising:

a long wavelength active region having opposed major sides with a first electrical contact on one of the major sides and a second electrical contact on another of the major sides;

at least one layer of material included in the long wavelength active region and having an electrically conductive portion defining a lasing aperture and current confinement volume, the electrically conductive portion being limited by an electrically insulating portion;

a first window in the second electrical contact in alignment with the lasing aperture and a first mirror stack positioned on the long wavelength active region in the first window;

a second window in the first electrical contact in alignment with the lasing aperture and a second mirror stack positioned on the long wavelength active region in the second window, one of the first mirror stack and the second mirror stack including a first metamorphic distributed Bragg reflector; and a contact metal in electrical interaction with the second electrical contact and in thermal interaction with the first distributed Bragg reflector mirror stack.

2. An electrically pumped, long-wavelength vertical cavity surface emitting laser as claimed in claim 1 wherein the electrically conductive portion of the at least one layer of material containing aluminum and the electrically insulating portion of the at least one layer of material includes aluminum oxide.

3. An electrically pumped, long-wavelength vertical cavity surface emitting laser as claimed in claim 1 wherein the at least one layer of material includes two layers, one each positioned on opposite sides of the long wavelength active region, with each of the two layers having an electrically conductive portion defining a lasing aperture and current confinement volume and the electrically conductive portion limited by an electrically insulating portion.

4. An electrically pumped, long-wavelength vertical cavity surface emitting laser as claimed in claim 3 wherein the electrically conductive portion of the two layers of material containing aluminum and the electrically insulating portion of the two layer of material includes aluminum oxide.

5. An electrically pumped, long-wavelength vertical cavity surface emitting laser as claimed in claim 3 wherein the long wavelength active region includes the first electrical contact, a first cladding region, a first layer of material having an electrically conductive portion defining a lasing aperture and current confinement volume limited by an electrically insulating portion, a plurality of active layers forming multiple quantum wells and interspersed barrier layers, a second layer of material having an electrically conductive portion defining the lasing aperture and current confinement volume limited by an electrically insulating portion, a second cladding region, and the second electrical contact.

6. An electrically pumped, long-wavelength vertical cavity surface emitting laser as claimed in claim 5 wherein the first electrical contact and the second electrical contact each include InGaAs based material.

7. An electrically pumped, long-wavelength vertical cavity surface emitting laser as claimed in claim 5 wherein the first cladding region and the second cladding region each include one of InGaAsP and InGaAlAs based material.

8. An electrically pumped, long-wavelength vertical cavity surface emitting laser as claimed in claim 5 wherein the plurality of active layers each include one of InGaAsP and InGaAlAs based material.

9. An electrically pumped, long-wavelength vertical cavity surface emitting laser as claimed in claim 5 wherein the first cladding region and the second cladding region each include material with a higher bandgap than the plurality of active layers.

10. An electrically pumped, long-wavelength vertical cavity surface emitting laser as claimed in claim 1 wherein the first metamorphic distributed Bragg reflector includes AlGaAs based layers of material.

11. An electrically pumped, long-wavelength vertical cavity surface emitting laser as claimed in claim 1 wherein the one of the first mirror stack and the second mirror stack includes the first metamorphic distributed Bragg reflector and another of the first mirror stack and the second mirror stack includes one of a second metamorphic distributed Bragg reflector and a dielectric mirror stack.

12. A method of fabricating an electrically pumped, long-wavelength vertical cavity surface emitting laser comprising the steps of:

forming a long wavelength active region having opposed major sides with a first electrical contact on one of the major sides and a second electrical contact on another of the major sides;

including at least one layer of material in the long wavelength active region having an electrically conductive portion defining a lasing aperture and current confinement volume, the electrically conductive portion being limited by an electrically insulating portion;

forming a first window in the second electrical contact in alignment with the lasing aperture and metamorphically depositing a first distributed Bragg reflector mirror stack on the long wavelength active region in the first window;

forming a second window in the first electrical contact in alignment with the lasing aperture and depositing a second mirror stack on the long wavelength active region in the second window; and depositing a contact metal in electrical interaction with the second electrical contact and in thermal interaction with the first distributed Bragg reflector mirror stack.

13. A method of fabricating an electrically pumped, long-wavelength vertical cavity surface emitting laser as claimed in claim 12 wherein the step of including at least one layer of material in the long wavelength active region having the electrically conductive portion includes depositing a layer of semiconductor material containing aluminum and oxidizing a portion of the layer of semiconductor material containing aluminum to form the electrically insulating portion.

14. A method of fabricating an electrically pumped, long-wavelength vertical cavity surface emitting laser as claimed in claim 13 wherein the step of depositing the layer of semiconductor material containing aluminum includes depositing one of InAlAs and AlAsSb material.

15. A method of fabricating an electrically pumped, long-wavelength vertical cavity surface emitting laser as claimed in claim 12 wherein the step of metamorphically depositing a distributed Bragg reflector mirror stack includes metamorphically growing alternate layers of $Al_xGa_{1-x}As$ and $Al_yGa_{1-y}As$, where x is in a range of from approximately 0.5 to 1 and y is in a range of from approximately 0 to 0.5.

16. A method of fabricating an electrically pumped, long-wavelength vertical cavity surface emitting laser comprising the steps of:

epitaxially depositing a first electrical contact on a compatible substrate;

epitaxially depositing a long wavelength active region on the first electrical contact, the long wavelength active region including at least one layer of transformable material having an electrically conductive state and transformable into an electrically insulating state;

depositing a second electrical contact on the long wavelength active region;

transforming a portion of the transformable material to define a lasing aperture and current confinement volume;

forming a first window in the second electrical contact in alignment with the lasing aperture and depositing a first mirror stack on the long wavelength active region in the first window;

removing at least a portion of the compatible substrate and forming a second window in the first electrical contact in alignment with the lasing aperture;

depositing a second mirror stack on the long wavelength active region in the second window;

one of the steps of depositing the first mirror stack and the second mirror stack including metamorphically growing a distributed Bragg reflector mirror stack; and depositing a contact metal in thermal interaction with the metamorphically grown distributed Bragg reflector mirror stack.

17. A method of fabricating an electrically pumped, long-wavelength vertical cavity surface emitting laser as claimed in claim 16 wherein the step of epitaxially depositing the long wavelength active region including at least one layer of transformable semiconductor material includes depositing a layer containing aluminum.

18. A method of fabricating an electrically pumped, long-wavelength vertical cavity surface emitting laser as claimed in claim 17 wherein the step of transforming the portion of the transformable material includes laterally oxidizing a portion of the aluminum containing semiconductor material.

19. A method of fabricating an electrically pumped, long-wavelength vertical cavity surface emitting laser as claimed in claim 16 wherein the steps of epitaxially depositing the first electrical contact on the compatible substrate and epitaxially depositing the long wavelength active region on the first electrical contact include epitaxially growing an indium based first electrical contact and an indium phosphide based active region on an indium phosphide based substrate.

20. A method of fabricating an electrically pumped, long-wavelength vertical cavity surface emitting laser as claimed in claim 16 wherein the step of metamorphically growing the distributed Bragg reflector mirror stack includes metamorphically growing alternate layers of $Al_xGa_{1-x}As$ and $Al_yGa_{1-y}As$, where x is in a range of from approximately 0.5 to 1 and y is in a range of from approximately 0 to 0.5.

* * * * *

UNITED STATES PATENT AND TRADEMARK OFFICE
CERTIFICATE OF CORRECTION

PATENT NO. : 6,542,530 B1
DATED : April 1, 2003
INVENTOR(S) : Shieh, Chan-Long and Tsao, Jeff It is certified that error appears in the above-identified patent and that said Letters Patent is hereby corrected as shown below:

<u>Column 5,</u>
Line 46, replace "erg" with -- e.g. --

Signed and Sealed this

Second Day of March, 2004

JON W. DUDAS
*Acting Director of the United States Patent and Trademark Office*